(12) United States Patent
Friend et al.

(10) Patent No.: US 6,518,700 B1
(45) Date of Patent: Feb. 11, 2003

(54) ORGANIC LIGHT-EMITTING DEVICES

(75) Inventors: Richard Henry Friend, Cambridge (GB); Karl Pichler, Cupertino, CA (US); Ichio Yudasaka, Suwa (JP)

(73) Assignees: Cambridge Display Technology Limited, Cambridge (GB); Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/640,619

(22) Filed: Aug. 17, 2000

Related U.S. Application Data

(63) Continuation of application No. PCT/GB99/00381, filed on Feb. 5, 1999.

(30) Foreign Application Priority Data

Feb. 23, 1998 (GB) .............................................. 9803764

(51) Int. Cl.$^7$ ........................ H05B 33/00; H05B 33/02; H05B 33/22
(52) U.S. Cl. ...................... 313/504; 313/506; 313/509; 313/501
(58) Field of Search ............................... 313/498–512, 313/495, 496, 497; 359/58, 60; 315/169.3; 428/690, 917

(56) References Cited

U.S. PATENT DOCUMENTS

| | | | | |
|---|---|---|---|---|
| 4,042,854 A | * | 8/1977 | Luo et al. ..................... | 313/505 |
| 4,539,507 A | | 9/1985 | VanSlyke et al. ............. | 313/504 |
| 4,566,935 A | | 1/1986 | Hornbeck ..................... | 156/626 |
| 4,693,906 A | * | 9/1987 | Lindmayer ................... | 427/69 |
| 4,759,610 A | * | 7/1988 | Yanagisawa .................. | 350/334 |
| 5,377,031 A | | 12/1994 | Vu et al. ....................... | 359/59 |
| 5,396,354 A | * | 3/1995 | Shimada et al. ............... | 359/58 |
| 5,529,853 A | * | 6/1996 | Hamada et al. ............... | 313/504 |
| 5,640,067 A | * | 6/1997 | Yamauchi et al. ............. | 313/504 |
| 5,684,365 A | * | 11/1997 | Tang et al. .................... | 313/500 |
| 5,706,022 A | | 1/1998 | Hato ............................. | 345/92 |
| 5,724,107 A | * | 3/1998 | Nishkawa et al. ............ | 349/38 |
| 5,804,917 A | * | 9/1998 | Takahashi et al. ............ | 313/504 |
| 5,932,327 A | * | 8/1999 | Inoguchi et al. ............. | 313/503 |
| 6,072,450 A | * | 6/2000 | Yamada et al. ............... | 313/500 |
| 6,107,734 A | * | 8/2000 | Tanaka et al. ................ | 313/506 |
| 6,114,715 A | * | 9/2000 | Hamada ........................ | 257/72 |

FOREIGN PATENT DOCUMENTS

| | | |
|---|---|---|
| EP | 0 580 445 A2 | 1/1994 |
| EP | 0 717 445 A2 | 6/1996 |
| JP | 57-18364 | 1/1982 |
| JP | 61-116324 | 6/1986 |
| JP | 4-225328 | 8/1992 |
| JP | 5-107550 | 4/1993 |
| JP | 5-173183 | 7/1993 |
| JP | 6-301052 | 10/1994 |
| JP | 7-253589 | 10/1995 |
| JP | 8-152612 | 6/1996 |
| WO | WO 90/13148 | 11/1990 |

OTHER PUBLICATIONS

Gyoutoku et al., "An organic electroluminescent dot–matrix display using carbon underlayer," Synthetic Metals, 91:73–75 (1997).
International Search Report for PCT/GB 99/00381.
International Preliminary Examination Report for PCT/GB99/00381.

* cited by examiner

Primary Examiner—Nimeshkumar D. Patel
Assistant Examiner—Mariceli Santiago
(74) Attorney, Agent, or Firm—Marshall, Gerstein & Borun

(57) ABSTRACT

An organic light-emitting device comprising a transparent cover sheet; a region of organic light-emitting material behind the cover sheet; a region of circuitry behind the cover sheet for regulating the flow of current to the organic light-emitting material; and a non-light-transmissive layer which lies between the cover sheet and the circuitry.

23 Claims, 2 Drawing Sheets

ORGANIC LIGHT-EMITTING DEVICES

CROSS-REFERENCE TO RELATED APPLICATION

This is a continuation of International Application No. PCT/GB99/00381 filed Feb. 5, 1999, the entire disclosure of which is incorporated herein by reference.

BACKGROUND OF THE INVENTION

1. Field of the Invention

This invention relates to display devices, especially ones that use an organic material for light emission.

2. Description of Related Technology

One type of electroluminescent display device is described in PCT/WO90/13148, the contents of which are incorporated herein by reference. The basic structure of this device is a light-emitting polymer film (for instance a film of a poly(p-phenylenevinylene)—"PPV") sandwiched between two electrodes, one of which injects electrons and the other of which injects holes. The electrons and holes excite the polymer film, emitting photons. These devices have potential as flat panel displays.

Another type of organic light-emitting device is a small molecule device, details of which are given in U.S. Pat. No. 4,539,507, the contents of which are incorporated herein by reference. These have a light-emitting layer which comprises at least one small molecule material such as tris(8-hydroxyquinoline)aluminium ("Alq$_3$") sandwiched between the two electrodes.

In an organic light-emitting display device the organic light-emitting layer is generally divided into individual pixels, which can be switched between emitting and non-emitting states by altering the current flow through them. The pixels are generally arranged in orthogonal rows and columns. Two alternative arrangements for controlling the pixels are generally used: passive matrix and active matrix. In a passive matrix device one of the electrodes is patterned in rows and the other in columns. Each pixel can be caused to emit light by applying an appropriate voltage between the row and column electrodes at whose intersection it lies. In an active matrix display circuitry is provided so that each pixel can be left in an emitting state whilst another pixel is addressed.

FIG. 1 shows a schematic cross-section through an active matrix organic light emitting device. The device is based on a glass sheet 1 which is covered with a passivation layer 2. Each pixel has a ion of circuitry 3, comprising thin-film transistors (TFTs), for regulating the supply of current to the pixel. The output of the circuitry 3 is provided to transparent anode electrode 4, which is spaced from the glass. Behind the anode 4 lies at least one layer 6 of light-emitting organic material. A cathode electrode 7 is provided behind the light-emitting layer 6. Banks 8 of insulating material are provided to separate neighbouring light-emitting regions and to insulate the rear of the circuitry 3. When the circuitry 3 is controlled to turn the pixel on, current is supplied to the anode 4 and flows through the light emitting layer to the cathode 7, causing light to be emitted.

TFT devices are well-known in the field of LCD displays. In that field work has been done in with the aim of improving contrast by reducing undesired reflection of ambient light from LCD displays. It has been suggested that black material should be located in line (in the viewing direction) with the TFT circuitry to protect the TFTs by absorbing incident light and also blocking light from any backlight fitted to the display. Examples of such proposals are disclosed in JP 57-18364, JP 61-116324, JP 4-225328, JP 5-107550, JP 5-173183, JP 6-301052 and JP 8-152612.

For similar reasons it has been proposed in JP application number 9-57862 to provide a black material behind a thin metal electrode (analogous to cathode 7 above). However, this does not protect the TFT circuitry from interference from incident light. Nor does it solve a specific problem of organic light-emitting devices, which is that, unlike e.g. typical LCD displays, the pixels of organic light-emitting devices normally emit light at a wide angular spread. Light that is emitted particularly widely can be waveguided by the glass cover sheet 1, as illustrated by arrow A in FIG. 1. This trapped light reduces the efficiency of the display and causes cross-talk between neighbouring pixels and increases the exposure of the TFTs to light from the pixels themselves.

SUMMARY OF THE INVENTION

According to a first aspect of the present invention there is provided an organic light-emitting device comprising: a transparent cover sheet; a region of organic light-emitting material behind the cover sheet; a region of circuitry behind the cover sheet for regulating the flow of current to the organic light-emitting material; and a non-light-transmissive layer which lies between the cover sheet and the circuitry.

The non-light transmissive layer may be light-absorbent and/or light-reflective.

The non-light-transmissive layer is preferably non-light-transmissive (e.g. light-absorbent) in (and preferably throughout) the visible frequency range, most preferably non-light-transmissive at the frequency at which the light-emitting material emits light. The non-light-transmissive layer is suitably a low light reflectance and/or high light absorption layer. The non-light-transmissive layer preferably has a reflectance of less than 30%, 20%, 15% or 10% at visible light wavelengths. The layer may, for example, be black or brown or another colour.

Preferably the non-light-transmissive layer is adjacent to the cover sheet, and most preferably the major surface of the non-light-transmissive layer lies in contact with the cover sheet. Preferably the non-light-transmissive layer lies between all of the region of circuitry (suitably including any or all data, signal etc. lines) and the cover sheet, to inhibit light from outside the device from reaching the circuitry and reducing contrast. Preferably none of the non-light-transmissive layer lies between the light-emitting region and the cover sheet, so as to allow light from the light-emitting region to leave the device. The non-light-transmissive layer may thus define a light-transmissive hole whose location corresponds to the region of light-emitting material. The non-light-transmissive region may thus frame the region of light-emitting material.

The device may comprise a plurality of regions of organic light-emitting material behind the cover sheet, which suitable correspond to pixels or sub-pixel units of the device. The device may comprise a plurality of regions of circuitry behind the cover sheet, each for regulating the flow of current to a respective one of the regions of organic light-emitting material. The or each organic light-emitting region is suitably framed by the non-light-transmissive layer; therefore, the non-light-transmissive layer may be of a lattice configuration, defining a regularly-spaced array of light-transmissive regions each corresponding to a respective one of the regions of organic light-emitting material.

The non-light-transmissive layer suitably comprises a metal, preferably a refractory metal. The non-lighttransmissive layer may comprise an alloy. The non-light-transmissive layer may comprise a non-light-transmissive metal oxide, preferably a refractory metal oxide. The oxide is suitably a non-stoichiometric metal oxide. The non-light-transmissive layer may comprise a chromium oxide.

The or each light-emitting region suitably comprises a light-emitting polymer material, preferably a conjugated material. A suitable material is a semiconductive conjugated polymer such as PPV or a derivative thereof. The light-emitting material of which the or each light-emitting region is formed suitably is or comprises PPV, poly(2-methoxy-5 (2'-ethyl)hexyloxyphenylene-vinylene) ("MEH-PPV"), a PPV-derivative (e.g. a di-alkoxy or di-alkyl derivative), a polyfluorene and/or a co-polymer incorporating polyfluorene segments, PPVs and/or related co-polymers. It could be deposited by spin-coating, dip-coating, blade-coating, meniscus-coating, self-assembly, ink-jet printing etc. The constituent of the light-emitting region and/or its precursor may be water-based: examples are precursor-based PPVs. Alternative materials include organic molecular light-emitting materials, e.g. Alq$_3$, or any other small sublimed molecule or conjugated polymer electroluminescent material as known in the prior art. The material may be deposited by vacuum sublimation.

According to a second aspect of the present invention there is provided a method for forming an organic light-emitting device, comprising the steps of: depositing a region of a non-light-transmissive layer over a transparent cover sheet; depositing a region of organic light-emitting material over an area of the transparent cover sheet that is not covered by the non-light-transmissive layer; depositing over the non-light-transmissive layer a region of circuitry for regulating the flow of current to the organic light-emitting material.

The non-light-transmissive layer may be deposited by sputtering or vapour deposition. Other preferred features of the method correspond to those described above in relation to the first aspect of the invention.

BRIEF DESCRIPTION OF THE DRAWINGS

The present invention will now be described by way of example with reference to the accompanying drawings, in which.

DETAILED DESCRIPTION OF PREFERRED EMBODIMENTS

Figure 1:
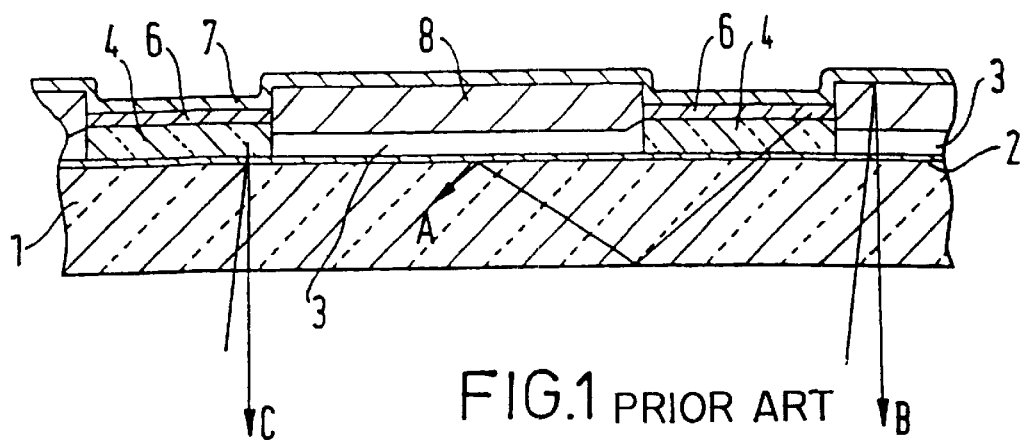
FIG. 1 shows a schematic cross-section through an active matrix organic light-emitting device.
Figure 2:
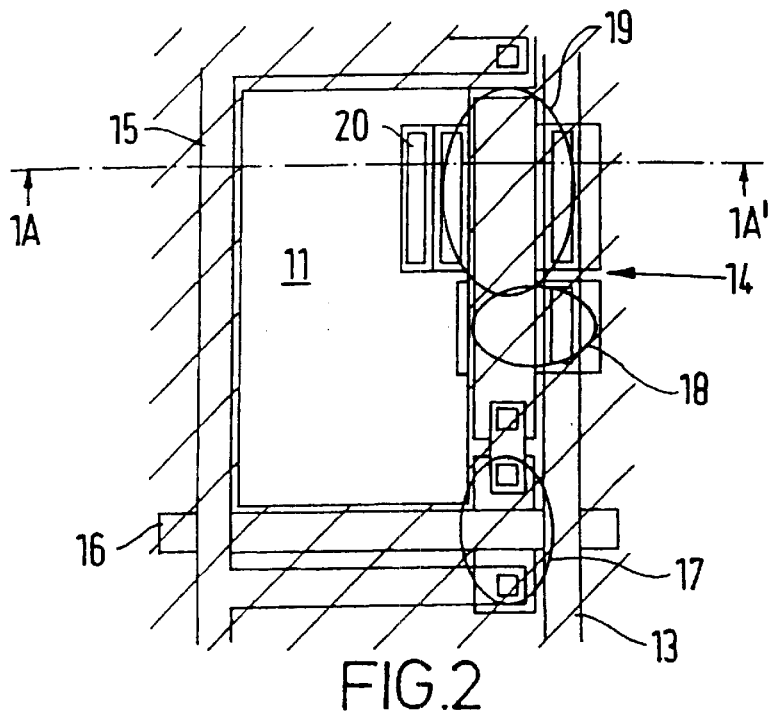
FIG. 2 shows a schematic plan view of part of an organic light-emitting display device.
Figure 3:
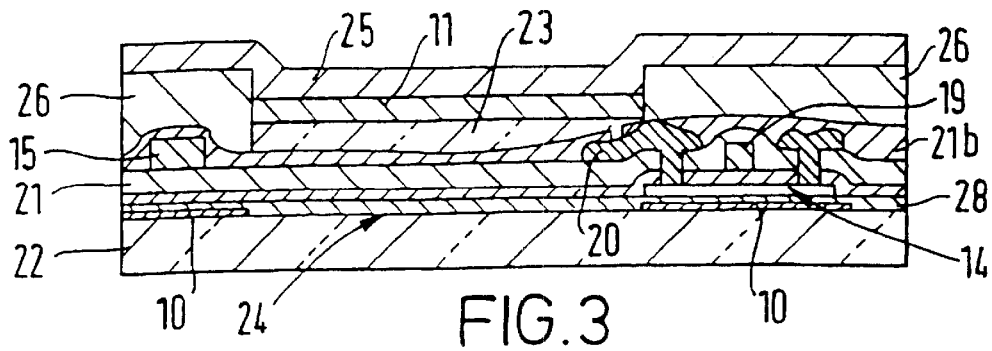
FIG. 3 shows a cross-section of the device of FIG. 2 on the line 1A–1A' of FIG. 2.

FIG. 3 shows a device structure which is generally similar to that of FIG. 1. However, in the structure of FIG. 3 there is a layer 10 of light-absorbent material between the circuitry 14 (which corresponds to circuitry 3 in FIG. 1) and the glass sheet 22 (which corresponds to glass sheet 1 in FIG. 1). The circuitry includes data, signal, common etc. lines. This light-absorbing material provides a number of advantages.
1. It reduces waveguiding in the glass sheet, by absorbing light that is reflected back by the outer surface of the glass sheet.
2. It increases the display's contrast, by reducing the amount of incident light from outside the display that is reflected back towards a viewer. In the device of FIG. 1 incident light can be reflected back towards a viewer by the cathode 7 or the TFT circuitry 3 (see arrows B and C in FIG. 1). In the device of FIGS. 2 and 3 this light is absorbed by the layer 10.
3. It protects the region of circuitry 14 from interference from incident light from outside the display. In the device of FIG. 1 incident light can cause problems when it hits the TFT circuitry.

As will be described in more detail below, advantages 2 and 3 are especially important for organic light-emitting devices because organic light-emitting materials provide the potential for relatively small light-emitting areas and correspondingly large areas of the light-absorbent material 10 which could reflect if the light-absorbent material 10 were not present or in which incident light could affect the TFT circuitry.

The display illustrated by FIGS. 2 and 3 is an active matrix organic light-emitting device using TFT circuitry. The whole display includes several thousand or more individual pixels, which are arranged in orthogonal rows and columns. For instance, one typical size is 800 columns by 600 rows, giving a total of 480,000 pixels. The device could be a colour display device having equal numbers of red, green and blue pixels.

Figure 4:
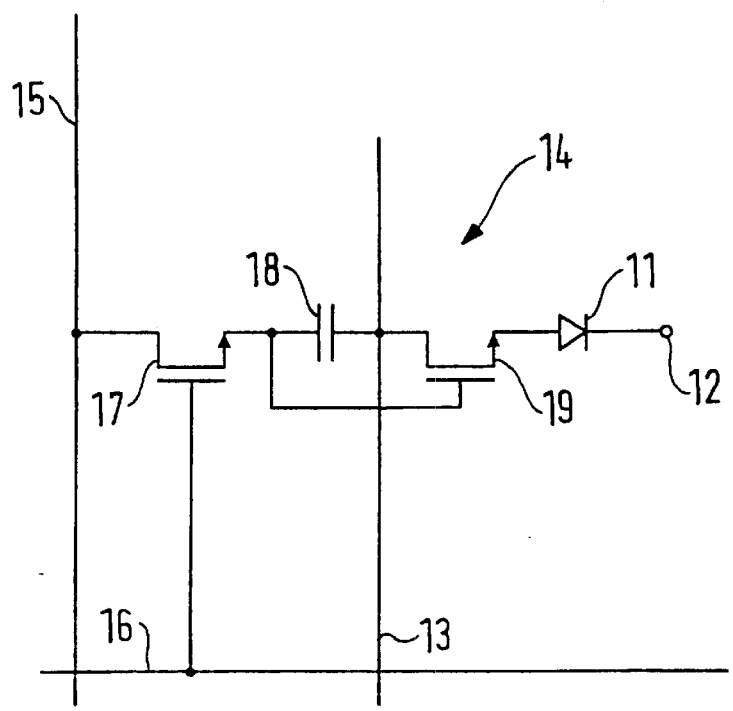
FIG. 4 is a diagram of the circuit used to control a pixel of the device.

Each pixel has an associated control circuit 14, which corresponds to the circuit shown in FIG. 4. FIG. 4 shows how this operates. The circuit comprises the light-emitting material of the pixel, illustrated as diode 11, which is connected between electrodes 12 and 13. Electrodes 12 and 13 are coupled to all the pixels of the device and a voltage sufficient for emission from the pixel is applied constantly between the electrodes 12 and 13. At least part of the switch circuit 14 lies between electrode 13 and the electrode 12. The switch circuit is controlled by way of row and column electrodes 15, 16. To cause the pixel 11 to emit light, voltages are applied to the electrode 16, to switch the switching transistor 17 on, and to electrode 15 to charge the storage capacitor 18. Electrodes 15 and 16 are then turned off. Since the capacitor 18 is charged the current transistor 19 is switched on and the voltage applied at electrode 13 is applied to the pixel, causing it to emit.

The circuit elements in FIG. 4 are given the same reference numerals in FIGS. 2 and 3. The other major components of the device of FIGS. 2 and 3 are the transparent anode electrode 23, which is connected to output terminal 20 of the circuitry 14; the organic light-emitting layer 11, the cathode electrode 25, the banks 26, the inter-layer insulator (or passivation) layer 21 and insulating layer 28.

To manufacture the device of FIGS. 2 and 3 the layer 10 of light-absorbent material is first deposited on the glass sheet 1. The layer 10 could be deposited selectively, over only the areas of the glass sheet that are to be overlain by circuitry and not over the areas that are to correspond to light-emitting pixels, or the layer 10 could be deposited more widely over the glass sheet and then patterned to remove it in the areas where light is to be emitted, using standard techniques such as photolithography. The layer 10 is shown by the cross-hatching in FIG. 2. It frames the light-emitting region when the device is viewed from the front, by defining a non-light-absorbent hole 24 through which light from the light-emitting region 11 can pass.

In this example, the layer 10 is a layer of chromium with an optical density of approximately 3.0. A thin chromium oxide layer under the chromium layer is preferable to reduce reflection. The thickness of the layer may suitably be approximately 100 nm, giving a reflection rate of around 15% for light of wavelength 500 nm. The thickness of the layer can be chosen to optimise the absorption characteristics of the layer at specific wavelengths. Both the chromium and the chromium oxide layers are deposited over the glass sheet by successive sputtering steps. Then the layer is wet etched to pattern it, removing the layer only in the areas that are to underlie light-emitting areas of the finished device. The etchant is a mixture of ammonium secondary cerium nitrate, perchlorc acid and de-ionised water.

Refractory metals (for instance chromium, tungsten, molybdenum, titanium and tantalum) and their nitrides and silicides (for instance $WSi_2$ or $MoSi_2$) and sub-stoichiometric oxides are among the suitable materials for the layer 10. These have the advantage that they are stable at high temperatures and therefore resist degradation during any subsequent annealing steps. The metals themselves can be deposited by sputtering in an inert atmosphere and the oxides and nitrides by sputtering in the presence of oxygen or nitrogen gas. The materials can be patterned by plasma etching using $CF_4$ as the etch gas. In general, non-stoichiometric (especially sub-stoichiometric) oxides are a preferred class of materials for the layer 10.

Other suitable materials for the layer 10 are carbon (especially amorphous carbon) and aluminium. Although aluminium has a relatively low melting point it could survive annealing if the annealing time was short—for instance if localised laser annealing with a pulse time of (for instance) less than 100 ns was used.

It is preferred that the layer 10 is an electrical insulator. This avoids stray capacitances between the layer 10 and the circuitry 14 and the data lines etc.

After the layer 10 has been deposited, and patterned if necessary, the remainder of the display device is deposited. Over the layer 10 and the glass sheet 22 a passivation layer 28 is deposited. This provides a sound substrate for subsequent deposition steps and insulates the layer 10 from the circuitry 14. Then the TFT circuitry 14 is deposited in the normal way, and the electrically insulating layer 21 of silicon dioxide deposited over it. The silicon dioxide can be annealed if required. The banks 26 of insulating material and the anode electrode 23, which is made of transparent indium-tin oxide (ITO), are deposited over the silicon dioxide layer 21. In general, the anode is preferably of a high work function material, suitably with a work function greater that 4 eV and most preferably greater than 4.5 eV. Another insulating layer 21b is deposited and patterned to allow access to the output terminal 20.

The layer 11 of organic light-emitting material is deposited over the electrode 23, and between the banks 26. In this example the organic light-emitting material is PPV. The PPV could be deposited as a layer over the entire device (e.g. by spin-coating a precursor polymer) and then patterned to form the separate light-emitting areas of individual pixels, or the light-emitting material of each pixel could be deposited separately (e.g. by ink-jet printing). If the light-emitting material of each pixel is deposited separately then the banks 26 are useful for defining the pixel boundaries. The light-emitting layer 11 is around 1000 Å thick. To deposit the light-emitting material by ink-jet printing the material is sprayed through an ink-jet printer spray head. A suitable spraying cycle is 14,400 drops per second, with a drop volume of 30 pl.

Finally, the cathode electrode 25 is deposited over the device. The cathode is preferably of a low work function material, suitably with a work function less than 3.5 eV and most preferably less than 3 eV. The layer may comprise a metal or alloy such as Al—Li, Yb, Sm, Ca, Tb etc.

Figure 5:
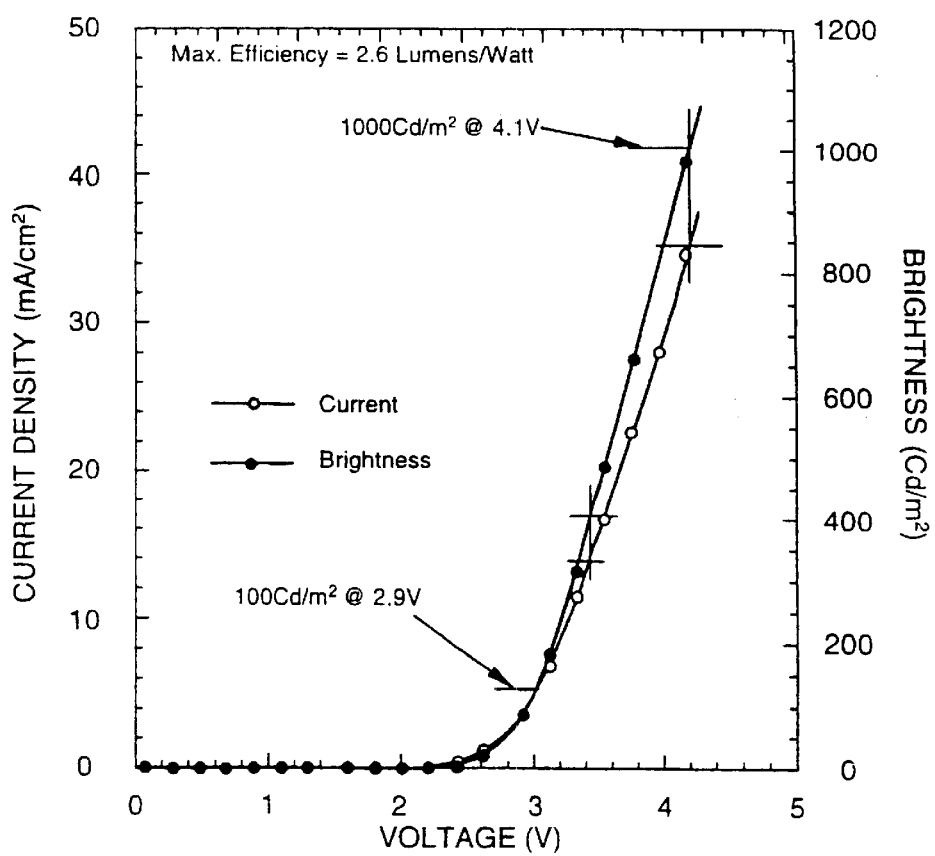
FIG. 5 shows a plot of current density and brightness against applied voltage for an organic light-emitting pixel.

Organic light-emitting materials are generally highly efficient. Therefore, in an organic light-emitting display device the light-emitting areas may only cover 25% or less of the total area of the display. The remainder is occupied by the circuitry for each pixel. For example, if the inter-pixel spacing is 300 µm in one direction and 100 µm in the other the pixel area could suitably be around 90×90 µm. As FIG. 5 shows, by increasing the voltage applied between the anode 23 and the cathode 25 the brightness per unit area can be increased, so the area occupied by the light emitting areas can be reduced even further—for instance down to 5% to 10% of the total display area—whilst brightness can maintained by driving the pixel harder. This allows the area occupied by the circuitry 14 to be increased, giving the circuitry greater current handling capacity. In this situation the anti-reflective layer 10 becomes even more important in reducing back reflection from ambient light and thereby maintaining good contrast. It should be noted that in devices that use other technologies for light emission there could be problems in dissipating heat from the active light-emitting regions of pixels that are as small as those described above. However, because the light-emiffing layer in a typical organic light-emitting device is so thin it can loose heat relatively easily to adjacent structures such as the bank 26 or the cathode 25. In LCD devices the drive is to increase the proportion of the device area devoted to pixels, to allow greater brightness and therefore increased contrast.

The presence of the anti-reflective layer 10 reduces the need for an external contrast filter as in prior art devices. An external contrast filter has the disadvantage that it can attenuate the device's emissions significantly.

It is preferred that the edges of the light-absorbent material 10 are flush with the edges of the light-emitting region of the pixel, as shown in FIG. 3. However, this is not essential. The edges of the light-absorbent material 10 could be proud of or recessed from the edges of the light-emitting region of the pixel when viewed perpendicular to the major plane of the device (i.e. in the viewing direction). In either case the light-absorbent material preferably takes the form of a lattice structure, each hole in which corresponds to a pixel of the device.

If the glass provided an adequate surface for subsequent deposition the passivation layer 28 could be omitted. In this case it is preferred that the light-absorbing layer 10 is not electrically conductive, to avoid damaging the performance of the circuitry 14 by a short circuit. If the light-absorbing layer provided an adequate surface for subsequent deposition it could be deposited over the passivation layer 28.

The layer 10 could be of a material that is light-reflective instead of or in addition to being light absorbent.

In addition to, or instead of, the layer 10 of light-absorbent material, the bank 26 could be made of non-light-transmissive material or could have a layer of non-light-transmissive material (preferably light-absorbent material) over it. The latter layer could be deposited over the bank and then patterned with the bank.

The separating region may comprise a light-transmissive separating layer and a non-light-transmissive separating layer behind the light-transmissive separating layer.

The circuitry 14 is controlled by a driver unit which provides the required signals to lines 13, 15 and 16. The driver unit, or at least part of it, could be on the backplane of the display.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. An organic light-emitting device comprising:
   a transparent cover sheet, which covers a viewing surface of said device;
   at least one region of organic light-emitting material behind the cover sheet;
   a region of circuitry behind the cover sheet for regulating the flow of current to the organic light-emitting material; and
   a non-light-transmissive layer which lies between the cover sheet and the circuitry, wherein the non-light-transmissive layer is adjacent to the cover sheet.

2. An organic light-emitting device as claimed in claim 1, wherein the non-light-transmissive layer is a light-absorbent layer.

3. An organic light-emitting device as claimed in claim 1, wherein the non-light-transmissive layer is coextensive with the region of circuitry.

4. An organic light-emitting device as claimed in claim 1, comprising a plurality of regions of organic light-emitting material behind the cover sheet.

5. An organic light-emitting device as claimed in claim 4, comprising a plurality of regions of circuitry behind the cover sheet, each for regulating the flow of current to a respective one of the regions of organic light-emitting material.

6. An organic light-emitting device as claimed in claim 1, wherein each organic light-emitting region is framed by the non-light-transmissive layer.

7. An organic light-emitting device as claimed in claim 1, wherein the non-light-transmissive layer has a reflectance of less than 20% in the visible frequency range.

8. An organic light-emitting device as claimed in claim 1, wherein the non-light-transmissive layer comprises a metal.

9. An organic light-emitting device as claimed in claim 1, wherein the non-light-transmissive layer comprises a refractory metal.

10. An organic light-emitting device as claimed in claim 1, wherein the non-light-transmissive layer comprises a non-stoichiometric metal oxide.

11. An organic light-emitting device as claimed in claim 1, wherein the non-light-transmissive layer comprises a metal layer and a metal oxide layer.

12. An organic light-emitting device as claimed in claim 1, wherein each light-emitting region is formed of a light-emitting polymer material.

13. An organic light-emitting device as claimed in claim 1, wherein each organic light-emitting region is formed of a light-emitting conjugated material.

14. An organic light-emitting device as claimed in claim 1, wherein each organic light-emitting region is formed of poly(p-phenylenevinylene).

15. An organic light-emitting device as claimed in claim 1, wherein the non-light-transmissive layer lies in contact with the cover sheet.

16. An organic light-emitting device as claimed in claim 1, wherein the non-light-transmissive layer is an insulator.

17. A method for forming an organic light-emitting device, comprising the steps of:
    depositing a region of a non-light-transmissive layer over a transparent cover sheet, which covers a viewing surface of said device;
    depositing a region of organic light-emitting material over an area of the transparent cover sheet that is not covered by the non-light-transmissive layer;
    depositing over the non-light-transmissive layer a region of circuitry for regulating the flow of current to the organic light-emitting material, wherein the non-light-transmissive layer is adjacent to the cover sheet.

18. A method as claimed in claim 17, comprising the step of depositing the non-light transmissive layer by sputtering.

19. A method as claimed in claim 17, wherein the region of light-emitting material is formed of a light-emitting polymer material.

20. A method as claimed in claim 17, wherein the region of light-emitting material is formed of a light-emitting conjugated material.

21. A method as claimed in claim 17, wherein the region of light-emitting material is formed of poly(p-phenylenevinylene).

22. An organic light-emitting device comprising:
    a transparent cover sheet, which covers a viewing surface of said device;
    at least two spaced-apart regions of organic light-emitting material behind the cover sheet;
    a region of circuitry comprising thin film transistors behind the cover sheet for regulating the flow of current to the organic light-emitting material; and,
    a non-light-transmissive separating region separating the regions of organic light-emitting material, wherein the non-light-transmissive separating region is adjacent to the cover sheet.

23. An organic light-emitting device as claimed in claim 22, wherein the separating region comprises a light-transmissive separating layer and a non-light-transmissive separating layer behind the light-transmissive separating layer.

* * * * *